United States Patent
Stoneking

[19]

[11] Patent Number: 5,835,891
[45] Date of Patent: Nov. 10, 1998

[54] DEVICE MODELING USING NON-PARAMETRIC STATISTICAL DETERMINATION OF BOUNDARY DATA VECTORS

[75] Inventor: Danny E. Stoneking, Oxnard, Calif.

[73] Assignee: Hewlett-Packard Company, Palo Alto, Calif.

[21] Appl. No.: 796,834

[22] Filed: Feb. 6, 1997

[51] Int. Cl.$^6$ .................................................. G01R 31/28
[52] U.S. Cl. ......................................... 702/117; 371/27.1
[58] Field of Search .................................. 364/570, 578, 364/480, 488, 550, 551.01, 554, 489, 490, 734; 324/537, 765; 382/181, 224, 225; 371/27, 22.5, 27.1–27.4, 24, 25.1, 22.1; 702/117

[56] References Cited

U.S. PATENT DOCUMENTS

| | | | |
|---|---|---|---|
| 4,571,697 | 2/1986 | Watanabe | 364/561 |
| 5,027,353 | 6/1991 | Jarwala et al. | 371/27.1 |
| 5,187,712 | 2/1993 | Malleo-Roach et al. | 371/22.1 |
| 5,414,716 | 5/1995 | Bershteyn | 371/27.1 |
| 5,485,471 | 1/1996 | Bershteyn | 371/27.2 |
| 5,638,489 | 6/1997 | Tsuboka | 395/3 |

OTHER PUBLICATIONS

J. H. Friedman, et al, *An Algorithm for Finding Best Matches in Logarithmic Expected Time*, ACM Transactions on Mathematical Software, vol. 3, No. 3, Sep. 1977, pp. 209–226.

*Primary Examiner*—John Barlow
*Assistant Examiner*—Craig Steven Miller

[57] ABSTRACT

In accordance with the preferred embodiment of the present invention, an electronic component is modeled. Performance of the electronic component is measured to produce a plurality of data vectors representing actual performance of the electronic component. Boundary vectors are selected from the plurality of data vectors. A density estimate is calculated for each data vector in the plurality of data vectors. A first selected number of the data vectors are partitioned from the plurality of data vectors into a partitioned group. The partitioned group includes the first selected number of data vectors from the plurality of data vectors with greatest density estimates. A second selected number of the partitioned group is selected as candidates for boundary vectors. The candidates for boundary vectors include the second selected number of the partitioned group with lowest density estimates. The boundary vectors are selected from the candidates for boundary vectors. From the boundary vectors, values are calculated for boundary model parameter vectors which model the electronic component. The nominal vector is chosen from the plurality of data vectors as the one with the highest density estimate.

20 Claims, 6 Drawing Sheets

DEVICE MODELING USING NON-PARAMETRIC STATISTICAL DETERMINATION OF BOUNDARY DATA VECTORS

BACKGROUND

The present invention concerns the designing and testing of integrated circuits or other electronics and pertains particularly to device modeling using non-parametric statistical determination of boundary (worst-case) data vectors.

During the course of manufacturing integrated circuits or other electronics, various circuitry is tested to determine performance of individual circuit components. The results are often quantified in order to be used in models which predict the performance of circuits which use the tested circuit components.

Even among circuit components manufactured on the same wafer using identical processing steps, there is a statistical variation of performance. Therefore, when attempting to accurately model circuitry, statistical variations in the performance of the circuit components are considered.

Generally, when determining nominal and worst-case performance for an individual circuit component, measured results are analyzed as if these form a Gaussian distribution. However, the actual distribution of measured results is often not Gaussian, but follows some other statistical pattern. It is desirable, therefore, to develop a more versatile approach to determine nominal and worst-case performance for circuit components.

SUMMARY OF THE INVENTION

In accordance with the preferred embodiment of the present invention, boundary vectors are selected from a plurality of data vectors. The data vectors are generated, for example by measuring actual performance of an electronic component.

A density estimate is calculated for each data vector in the plurality of data vectors. For example, the density estimate is calculated by first calculating an average distance from the current data vector to each of the all the other data vectors. Alternatively, the average distance from the current data vector to a subset of a preselected number of the all the other data vectors may be used. A density estimate is estimated for the current data vector as one divided by the average distance calculated.

In order to make more accurate the calculation of the density estimate, vector components for all data vectors within the plurality of data vectors can be scaled so that the plurality of data vectors are bounded by a unit hypercube. This is done, for example, before calculating the average distances.

A selected number of the data vectors are partitioned from the plurality of data vectors into a partitioned group. The partitioned group includes the data vectors from the plurality of data vectors with greatest density estimates. From the data vectors in the partitioned group, candidates for boundary vectors are selected. The candidates for boundary vectors have the lowest density estimates within the partitioned group.

In one embodiment, all the candidates for boundary vectors are actually used as boundary vectors. However, to abate clustering, the candidates for boundary vectors can include an oversample. In this case, for example, candidates are eliminated as follows. For all possible pairings of the candidates for boundary vectors, a pairing of candidates which are closest together is located. The candidate from the located pairing of candidates which has the higher density estimate is removed as a candidate. This process is repeated until the number of remaining candidates is equal to the desired number of boundary vectors.

Values for boundary model parameter vectors which model the electronic component can be calculated from the boundary vectors.

In the preferred embodiment, a nominal data vector is also selected. For example, the nominal data vector is selected as the data vector from the plurality of data vectors which has the highest density estimate. A nominal model parameter vector may be calculated from the nominal data vector.

The present invention is especially useful when a data set consists of data vectors which are not distributed in a Gaussian pattern.

DESCRIPTION OF THE PREFERRED EMBODIMENT

Figure 1:
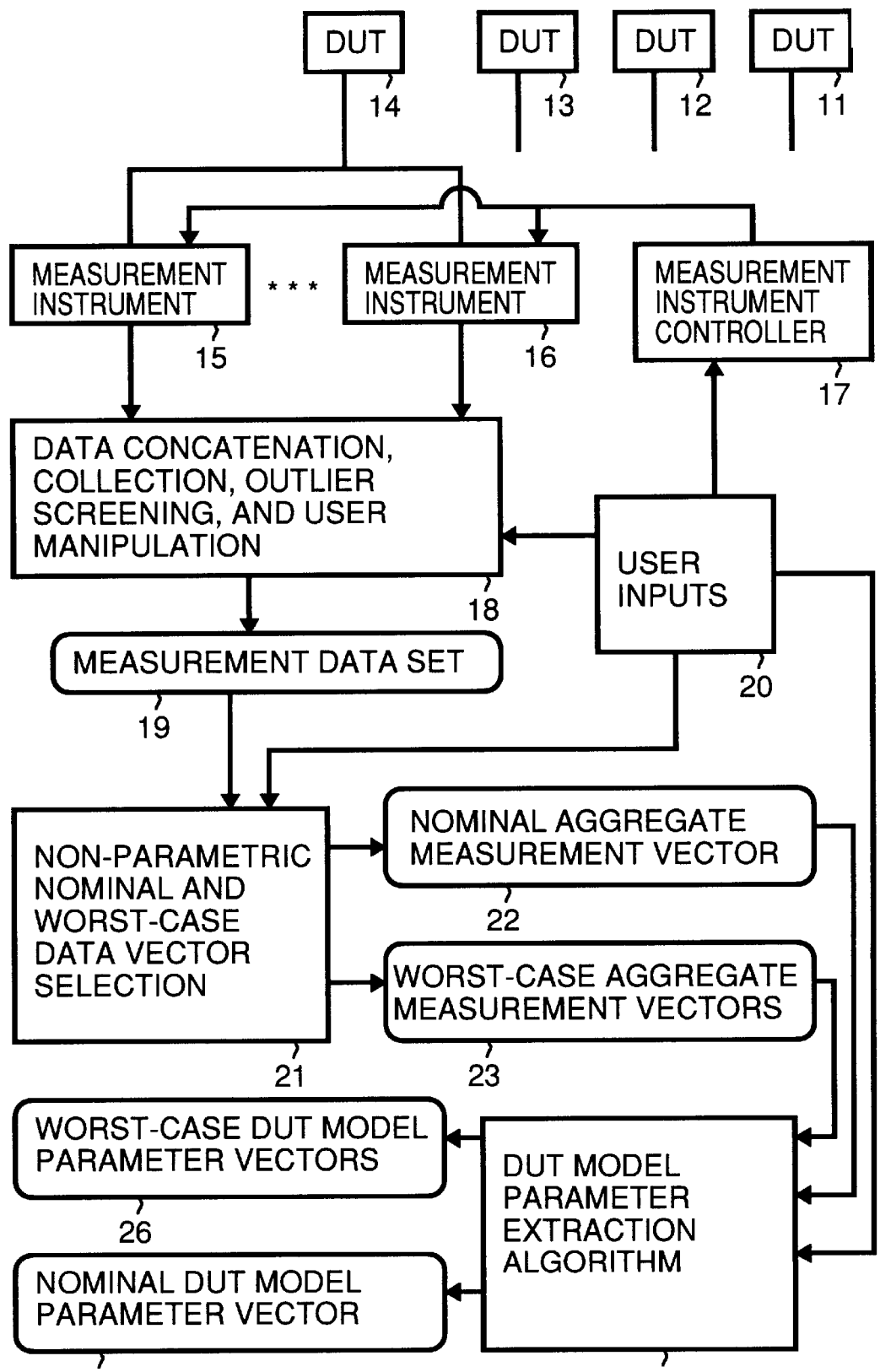
FIG. 1 is a material and information flow diagram for nominal and worst-case measurement selection in accordance with a preferred embodiment of the present invention.

FIG. 1 shows material and information flow diagram for nominal and boundary (worst-case) measurement selection in accordance with a preferred embodiment of the present invention. A device under test (DUT) 11, a DUT 12, a DUT 13 and a DUT 14 represent circuit components which are to be modeled. For example, each of DUT 11 through 14 is an active device such as a bipolar transistor, metal oxide semiconductor field effect transistor (MOSFET) or some other type of transistor. Alternatively, each of DUT 11 through 14 could be any type of electronic or integrated circuit component which has potential variation in performance.

During the course of testing, each DUT is connected to one or more measurement instruments. For example, in FIG. 1, DUT 14 is shown to be electrically connected to a measurement instrument 15 and a measurement instrument 16. For example, if DUT is on an integrated circuit, measurement instrument 15 and a measurement instrument 16 may be electrically connected to DUT 14 using probes placed on pads within DUT 14. The measurement instruments may be any type of electrical equipment. For example, one or more of measurement instrument 14 and measurement instrument 15 may be a parametric tester, a network analyzer or a curve tracer. Depending upon the type of measurement instrument used, the measurement instrument typically measures such things as current-voltage characteristics, output power, reflected power, various power ratios, and so on.

A measurement instrument controller 17 is used to control measurement instrument 15 and measurement instrument 16. Measurement instrument controller 17 is responsive to user inputs 20 which provide user control over the measurement process.

Also in accordance with user inputs 20, data from measurement instruments 15 and 16 are, for example, in a block 18, collected and/or concatenated. When indicated by user inputs, outlier screening is performed. Additional manipulations of the data also may be performed in accordance with user inputs 20.

As a result of concatenation, collection, outlier screen and/or user manipulation, a measurement data set 19 is produced. The data set includes a series of data vectors. For example, each data vector is a concatenation of data values from each measurement instrument. For example, if a first measurement instrument produces the following vector components: 5.62498, 95.8734, −2.964, 0.18436, 6.16035, 7.66075, −5.1199 and 20.0258; a second instrument produces the following vector component 1.13238; a third instrument produces the following vector components: 109.83, 4.59603, 8.90571, 9.4781, 0.0079 and 200.445; and a fourth instrument produces the following vector components: 33.153, 48.0487, 17.9629 and 4.33053; then the data vector could be, for example, a concatenation of these vector components as follows: 5.62498, 95.8734, −2.964, 0.18436, 6.16035, 7.66075, −5.1199, 20.0258, 1.13238, 109.83, 4.59603, 8.90571, 9.4781, 0.0079, 200.445, 33.153, 48.0487, 17.9629, 4.33053. For example, there may be many hundreds or even thousands of data vectors produced for each type of circuit component.

A non-parametric nominal and worst-case data vector selection block 21 is used to select nominal and boundary (worst-case) data vectors. Non-parametric nominal and worst-case data vector selection block 21 produces a nominal aggregate measurement vector 22 and worst-case aggregate measurement vectors 23. Non-parametric nominal and worst-case data vector selection block 21 operates under various constraints. For example, the number of worst-case aggregate measurement vectors 23 is based on user inputs 20.

A DUT model parameter extraction algorithm 24 utilizes nominal aggregate measurement vector 22 and worst-case aggregate measurement vectors 23 to produce nominal DUT model parameter vector 25 and worst-case DUT model parameter vectors 26. The parameter vectors are parameters used to model the various DUTs.

Since it is resource intensive to convert aggregate measurement vectors into model parameter vectors, the design shown in FIG. 1 has the advantage of utilizing non-parametric nominal and worst-case data vector selection block 21 to minimize the number of aggregate measurement vectors before converting the aggregate measurement vectors into model parameter vectors. However, in an alternative preferred embodiment of the present invention, the aggregate measurement vectors can be converted into model parameter vectors and a non-parametric nominal and worst-case data vector selection block can then be used to extract nominal and worst-case DUT model parameter vectors. This is illustrated, for example, by FIG. 2.

Figure 2:
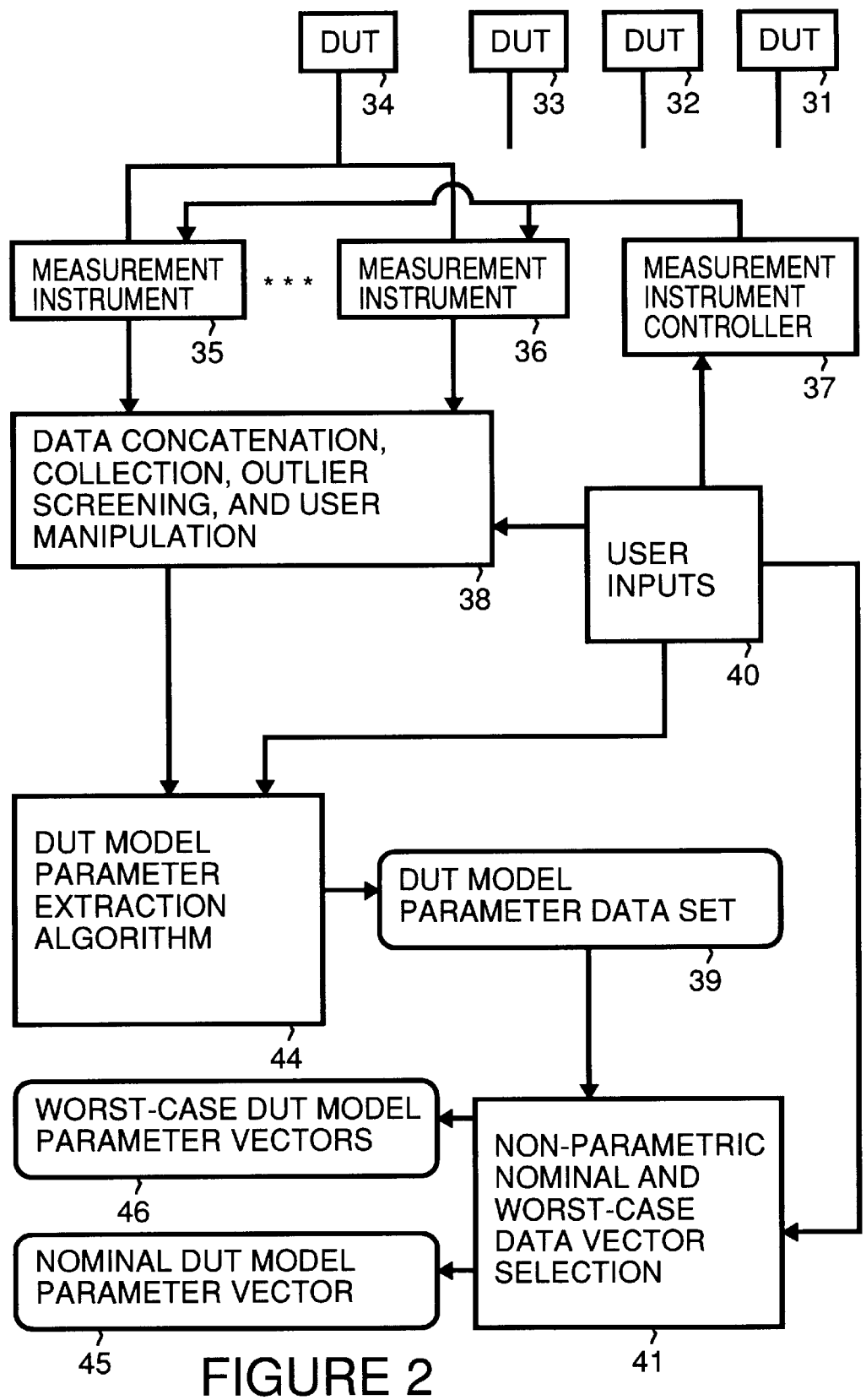
FIG. 2 is a material and information flow diagram for nominal and worst-case measurement selection in accordance with an alternative preferred embodiment of the present invention.

In FIG. 2, a device under test (DUT) 31, a DUT 32, a DUT 33 and a DUT 34 represent circuit components which are to be modeled. For example, each of DUT 31 through 34 is an active device such as a bipolar transistor, metal oxide semiconductor field effect transistor (MOSFET) or some other type of transistor. Alternatively, each of DUT 31 through 34 could be any type of electronic or integrated circuit component which has potential variation in performance.

During testing, each DUT is connected to one or more measurement instruments. For example, DUT 34 is shown to be electrically connected to a measurement instrument 35 and a measurement instrument 36. For example, if DUT is on an integrated circuit, measurement instrument 35 and a measurement instrument 36 may be electrically connected to DUT 34 using probes placed on pads within DUT 34. The measurement instruments may be any type of electrical equipment, as discussed above.

A measurement instrument controller 37 is used to control measurement instrument 35 and measurement instrument 36. Measurement instrument controller 37 is responsive to user inputs 40 which provide user control over the measurement process.

Also in accordance with user inputs 40, data from measurement instruments 35 and 36 are, for example, in a block 38, collected and/or concatenated. When indicated by user inputs, outlier screening is performed. Additional manipulations of the data also may be performed in accordance with user inputs 40.

A measurement data set produced, for example, as a result of concatenation, collection, outlier screen and/or user manipulation is received by a DUT model parameter extraction algorithm 44. DUT model parameter extraction algorithm 44 utilizes the measurement data set to produce a DUT model parameter data set 39, in accordance with user inputs 40.

A non-parametric nominal and worst-case data vector selection block 41 is used to select nominal and boundary (worst-case) data vectors. Non-parametric nominal and worst-case data vector selection block 41 produces a nominal DUT model parameter vector 45 and worst-case DUT model parameter vectors 46. The parameter vectors are parameters used to model the various DUTs.

Figure 3:
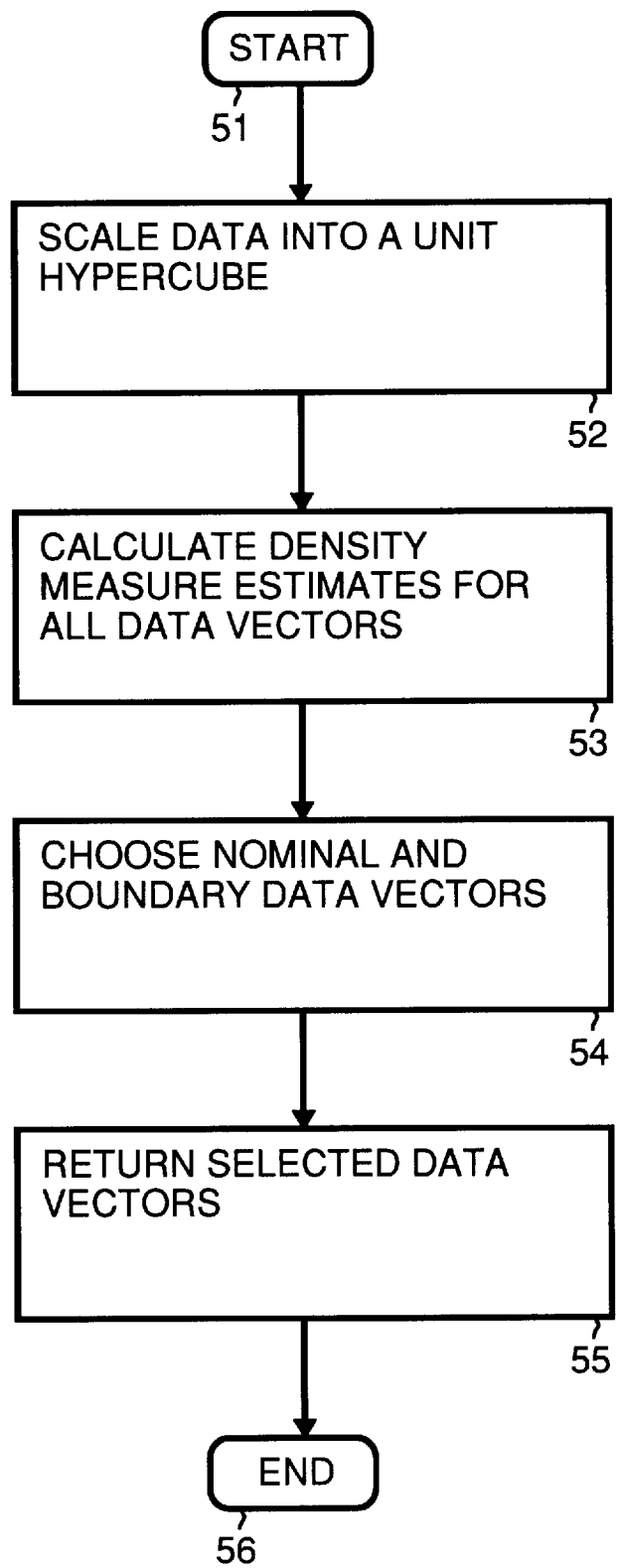
FIG. 3 is a flowchart which shows main functionality of nominal and worst-case data vector analysis in accordance with a preferred embodiment of the present invention.

FIG. 3 is a flowchart which shows main functionality of nominal and worst-case data vector analysis in accordance with a preferred embodiment of the present invention. That is, the flowchart illustrates how non-parametric nominal and worst-case data vector selection block 21 and non-parametric nominal and worst-case data vector selection block 41 function.

The nominal and worst-case data vector analysis is started in a step 51. In a step 52, data is scaled into a unit hypercube. This means that all the corresponding vector components for each data vector are scaled so that the spread of values for the corresponding vector components for each data vector are in a common range, for example, the range of 0 to 1. This gives equal weight to each vector component when calculating distances between data vectors. Step 52 is further expanded in FIG. 4.

In a step 53, density estimate estimates are calculated for all data vectors. That is, at the location of each data vector, a density estimate taking into account the location of all other data vectors is calculated. An example process for performing this is set out in FIG. 5.

In a step 54, a nominal data vector and boundary (worst-case) data vectors are chosen. The nominal data vector is the data vector with the highest density estimate, as calculated in step 53. The boundary (worst-case) data vectors are those data vectors which define a boundary of constant estimated density. For example, if the user wants the density boundaries to encompass 75% of the data vectors, then boundary data vectors are chosen so that 75% of the data vectors with the highest density estimate, as calculated within step 53, are within the boundaries delineated by the boundary data vectors. An example process for performing this is set out in FIG. 6.

In a step 55, the nominal data vector and the boundary (worst-case) vectors are returned. In a step 56, the nominal and worst-case data vector analysis is complete.

Figure 4:
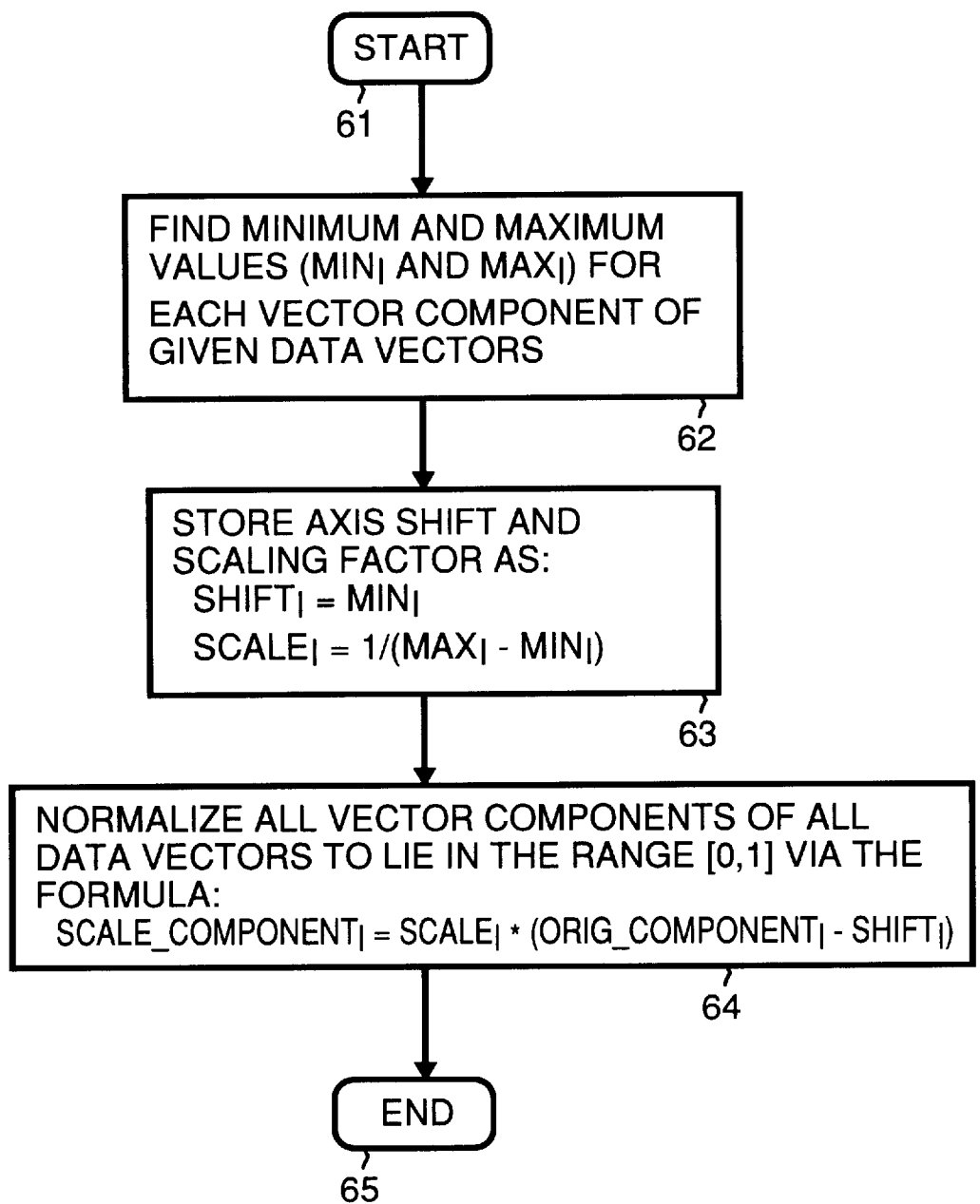
FIG. 4 is a flowchart which demonstrates normalization of a data set range to a unit hypercube in accordance with a preferred embodiment of the present invention.

FIG. 4 is a flowchart which presents an example of how to perform normalization of a data set of data vectors to fall within a unit hypercube. The normalization is begun in step 61.

In a step 62, for each vector component (I), the minimum value ($min_i$) and the maximum value ($max_i$) of the vector component across all the data vectors is calculated.

In a step 63, for each vector component (I), an axis shift ($shift_i$) and a scaling factor ($scale_i$) are calculated in accordance with Equation 1 below:

$$shift_i = min_i \quad scale_i = 1/(max_i - min_i) \qquad \text{Equation 1}$$

In a step 64, all vector components of all data vectors are normalized to lie in the same range. In the present example, the range is chosen to be between 0 and 1, however, any range may be chosen. For the range of [0,1], Equation 2 below may be used to perform a normalization of each original vector component ($orig\_component_i$) of each data vector to produce a scaled vector component ($scale\_component_i$):

$$scale\_component_i = scale_i * (orig\_component_i - shift_i) \qquad \text{Equation 2}$$

In a step 65, the normalization of a data set range to a unit hypercube is complete.

Figure 5:
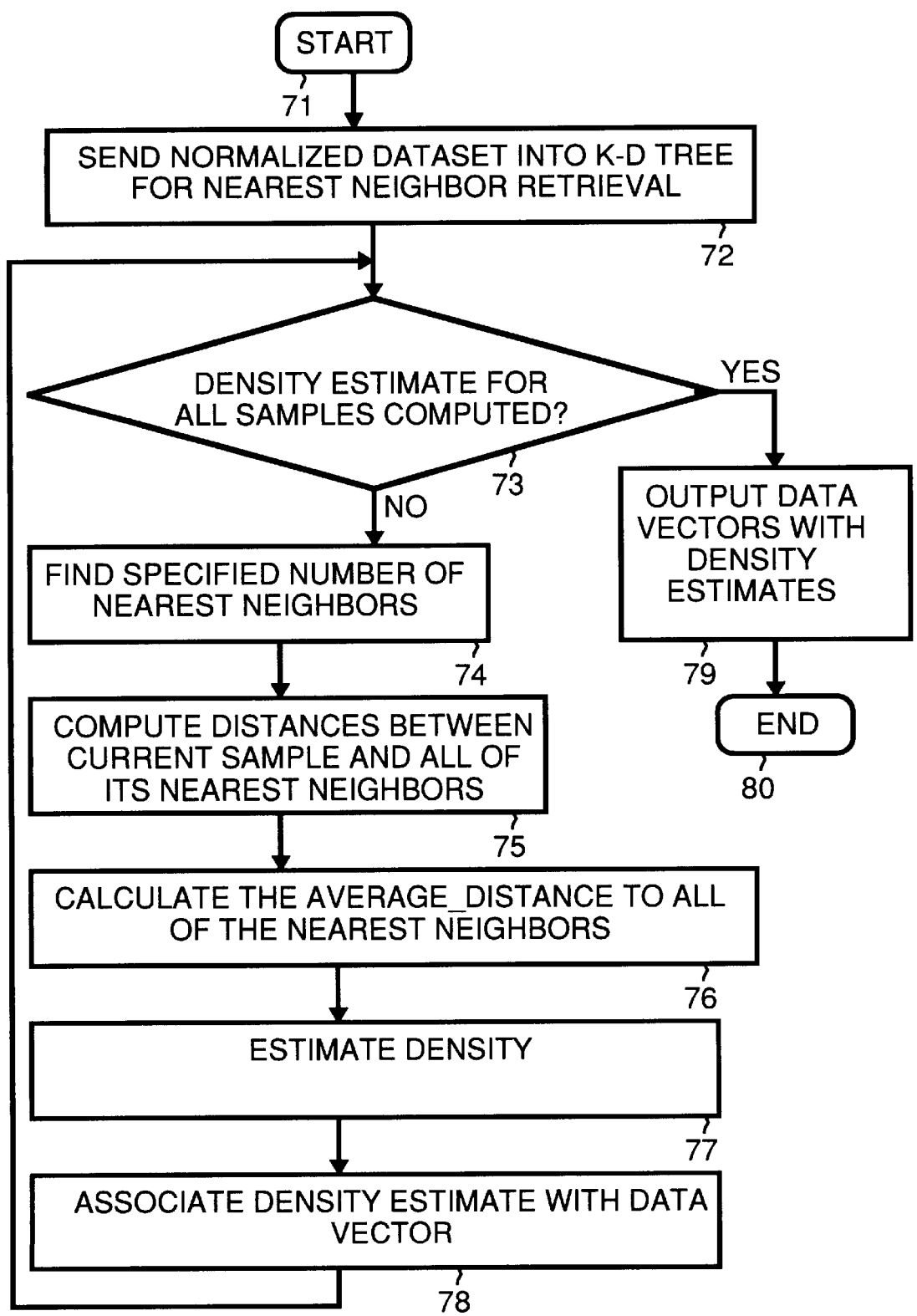
FIG. 5 is a flowchart which illustrates density estimation in accordance with a preferred embodiment of the present invention.

FIG. 5 is a flowchart which presents an example of how to perform density estimation. The density estimation is begun in a step 71.

In a step 72, the data set of data vectors with normalized vector components is sorted into a K-D tree for nearest neighbor retrieval. For information about using a K-D tree structure, see Jerome H. Friedman, et al, *An Algorithm for Finding Best Matches in Logarithmic Expected Time, ACM Transactions on Mathematical Software*, Vol. 3, No. 3, September 1977, pp. 209–226.

In a step 73, a check is made to see if a density estimate has been made for every data vector. If not, in a step 74, one of the remaining data vectors is selected as a current sample. For the current sample a specified number of the nearest neighbors is found. In the preferred embodiment, the specified number is the entire data set of data vectors with the exception of the current sample.

In a step 75, distances between the current sample and all of its nearest neighbors is computed. In a step 76, an average distance (average_distance) is computed to all of the nearest neighbors.

In a step 77, average density is estimated. This may be done by any known method of estimating or calculating density. In the preferred embodiment of the present invention, Equation 3 below is used to estimate density (Density):

$$Density = 1/(average\_distance) \qquad \text{Equation 3}$$

In a step 78, the estimated density for the current sample (data vector) is associated with the data vector. Then step 73 is again performed. If in step 73, it is determined that a density estimate has been made for every data vector, in a step 79, data vectors with associated density estimates serve as output from the density estimation. In a step 80, the density estimation is complete.

Figure 6:
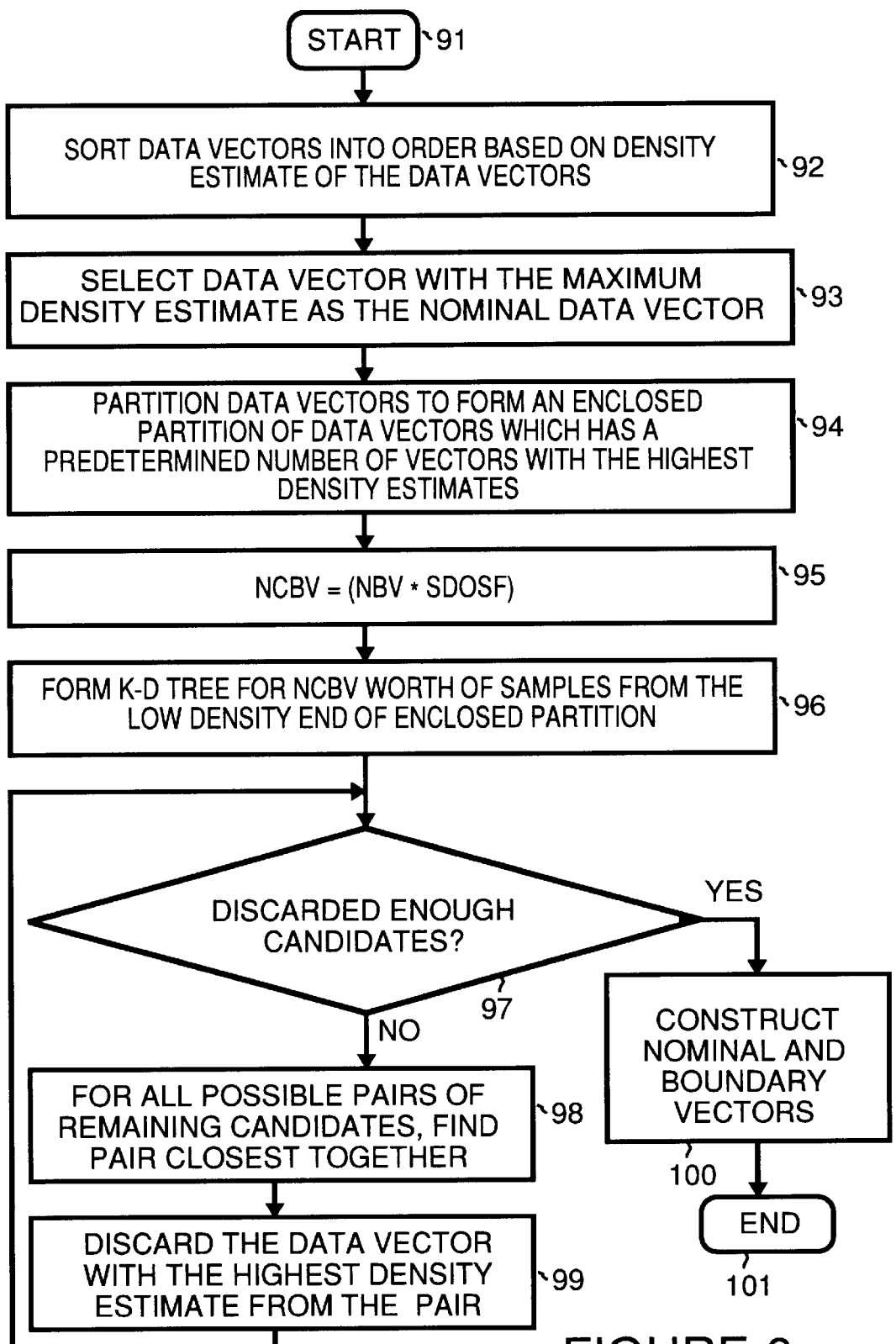
FIG. 6 is a flowchart which illustrates the choosing of nominal and boundary points in accordance with a preferred embodiment of the present invention.

FIG. 6 is a flowchart which presents an example of how to perform the choosing of nominal and boundary points. The choosing of nominal and boundary points is begun in a step 91.

In a step 92, the data set of data vectors with associated density estimates is sorted into a ranked order from the data vector with the highest density estimate to the data vector with the lowest density estimate. The density estimate for each data vector remains associated with the data vector.

In a step 93, the data vector with the maximum density estimate is selected as the nominal data vector.

In a step 94, the data vectors are partitioned to form an enclosed partition of a specified percentage of the data vectors with the highest density estimates. The specified percentage is user variable to allow customization to a particular application. Typically, the percentage is in a range from 75% to 99%.

In a step 94, in the preferred embodiment of the present invention, it is determined a number of data vectors which will be initially used as candidates for boundary vectors. In the preferred embodiment, as set out in a step 95, the number of candidate boundary vectors (NCBV) is equal to the number of boundary vectors (NBV) which are to be used times a spatial diversity oversampling factor (SDOSF). This is reflected in Equation 4 below:

$$NCBV = NBV * SDOSF \qquad \text{Equation 4}$$

In the preferred embodiment, both the number of boundary vectors (NBV) and the spatial diversity oversampling factor (SDOSF) are user chosen. The spatial diversity oversampling factor (SDOSF) can be selected, for example, based on the propensity of the data vectors to cluster. If the data vectors are particularly well distributed, then the spatial diversity oversampling factor (SDOSF) may be one, i.e., there is no oversampling done and just the boundary vectors are returned without further processing.

In a step 96, for the case where there is oversampling, a K-D tree is formed. In the K-D tree is placed the candidate boundary vectors. There are NCBV data vectors in the K-D tree. These NCBV data vectors are the NCBV data vectors within the enclosed partition (formed in step 94) which have the lowest density estimate.

In a step 97, a check is made to determine whether the remaining data vectors in the K-D tree is equal to the number of boundary vectors (NBV). If not, in a step 98, for all possible pairs within the K-D tree, the pair which is the closest distance together is found.

In a step 99, the data vector with the highest density estimate from the pair found in step 98 is discarded from the K-D tree. Then, returning to step 97, another check is made to determine whether the number of remaining data vectors in the K-D tree is equal to the number of boundary vectors (NBV). If the remaining data vectors in the K-D tree is equal to the number of boundary vectors (NBV), in a step 100, the nominal data vector and the boundary data vectors are constructed. The nominal vector is the data vector selected in step 93. The boundary vectors are the data vectors remaining in (i.e., not discarded from) the K-D tree. In a step 101, the selection of a nominal vector and boundary vectors is complete.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for modeling an electronic component comprising the following steps:
   (a) measuring performance of the electronic component to produce a plurality of data vectors representing actual performance of the electronic component;
   (b) selecting boundary vectors from the plurality of data vectors, including using a computing system to perform the following substeps:
      (b.1) calculating a density estimate for each data vector in the plurality of data vectors,
      (b.2) partitioning a first selected number of the data vectors from the plurality of data vectors into a partitioned group, the partitioned group including the first selected number of data vectors from the plurality of data vectors with greatest density estimates, as determined in substep (b.1),
      (b.3) selecting a second selected number of the partitioned group as candidates for boundary vectors, the candidates for boundary vectors including the second selected number of the partitioned group with lowest density estimates, as determined in substep (b.1), and
      (b.4) selecting the boundary vectors from the candidates for boundary vectors; and,
   (c) from the boundary vectors, calculating values for boundary model parameter vectors which model the electronic component.

2. A method as in claim 1 additionally comprising the following steps:
   (d) from the density estimate for each data vector calculated in substep (b.1), selecting a nominal data vector as a data vector from the plurality of data vectors which has a highest density estimate; and,
   (e) from the nominal data vector, calculating a value for a nominal model parameter vector which models the electronic component.

3. A method as in claim 1 wherein substep (b.1) comprises performing the following substeps for each data vector in the plurality of data vectors, for the performance of the following substeps, each data vector being a current data vector:
   (b.1.1) locating a third selected number of data vectors from the plurality of data vectors which are nearest to the current data vector;
   (b.1.2) calculating an average distance from the current data vector to each of the third selected number of data vectors from the plurality of data vectors which are nearest to the current data vector found in substep (b.1.1); and,
   (b.1.3) estimating a density estimate for the current data vector as one divided by the average distance calculated in substep (b.1.2).

4. A method as in claim 3 wherein in substep (b.1.1) the third selected number is equal to a total number of data vectors in the plurality of data vectors minus one.

5. A method as in claim 1 wherein step (b) additionally comprises the following substep performed before substep (b.1):

scaling vector components of all data vectors within the plurality of data vectors so that the plurality of data vectors are bounded by a unit hypercube.

6. A method as in claim 1 wherein substep (b.4) includes selecting all the candidates for the boundary vectors as the boundary vectors.

7. A method as in claim 1 wherein substep (b.4) comprises the following substeps:
   (b.4.1) for all possible pairings of the candidates for boundary vectors, selecting a pairing of candidates for boundary vectors which are closest together;
   (b.4.2) removing, from the candidates, a candidate from the pairing of candidates selected in substep (b.4.1) which has a higher density estimate as calculated in substep (b.1);
   (b.4.3) for candidates remaining after performance of substep (b.4.2), repeating substeps (b.4.1) and (b.4.2) until a number of remaining candidates is equal to a third selected number; and,
   (b.4.4) selecting the third selected number of remaining candidates as the boundary vectors.

8. A method for modeling an electronic component comprising the following steps:
   (a) measuring performance of the electronic component to produce a plurality of data vectors representing actual performance of the electronic component;
   (b) from the plurality of data vectors, calculating values for a plurality of model parameter vectors which model the electronic component; and,
   (c) selecting boundary vectors from the plurality of model parameter vectors, including using a computing system to perform the following substeps:
      (c.1) calculating a density estimate for each model parameter vector in the plurality of model parameter vectors,
      (c.2) partitioning a first selected number of the model parameter vectors from the plurality of model parameter vectors into a partitioned group, the partitioned group including the first selected number of model parameter vectors from the plurality of model parameter vectors with greatest density estimates, as determined in substep (c.1),
      (c.3) selecting a second selected number of the partitioned group as candidates for boundary vectors, the candidates for boundary vectors including the second selected number of the partitioned group with lowest density estimates, as determined in substep (c.1), and
      (c.4) selecting the boundary vectors from the candidates for boundary vectors.

9. A method as in claim 8 additionally comprising the following steps:
   (d) from the density estimate for each model parameter vector calculated in substep (c.1), selecting a nominal model parameter vector as a model parameter vector from the plurality of model parameter vectors which has a highest density estimate.

10. A method as in claim 8 wherein substep (c.1) comprises performing the following substeps for each model parameter vector in the plurality of model parameter vectors, for the performance of the following substeps, each model parameter vector being a current model parameter vector:
   (c.1.1) locating a third selected number of model parameter vectors from the plurality of model parameter vectors which are nearest to the current model parameter vector;

(c.1.2) calculating an average distance from the current model parameter vector to each of the third selected number of model parameter vectors from the plurality of model parameter vectors which are nearest to the current model parameter vector found in substep (c.1.1); and, (c.1.3) estimating a density estimate for the current model parameter vector as one divided by the average distance calculated in substep (c.1.2).

11. A method as in claim 10 wherein in substep (c.1.1) the third selected number is equal to a total number of model parameter vectors in the plurality of model parameter vectors minus one.

12. A method as in claim 8 wherein step (c) additionally comprises the following substep performed before substep (c.1):

scaling vector components of all model parameter vectors within the plurality of model parameter vectors so that the plurality of model parameter vectors are bounded by a unit hypercube.

13. A method as in claim 8 wherein substep (c.4) comprises the following substeps:

(c.4.1) for all possible pairings of the candidates for boundary vectors, selecting a pairing of candidates for boundary vectors which are closest together;

(c.4.2) removing, from the candidates, a candidate from the pairing of candidates selected in substep (c.4.1) which has a higher density estimate as calculated in substep (c.1);

(c.4.3) for candidates remaining after performance of substep (c.4.2), repeating substeps (c.4.1) and (c.4.2) until a number of remaining candidates is equal to a third selected number; and, (c.4.4) selecting the third selected number of remaining candidates as the boundary vectors.

14. Computer Readable Storage media which stores software for generating boundary vectors from a data set consisting of a plurality of data vectors, the software when executed on a computing system comprising:

calculating means for calculating a density estimate for each data vector in the plurality of data vectors;

partitioning means for partitioning a first selected number of the data vectors from the plurality of data vectors into a partitioned group, the partitioned group including the first selected number of data vectors from the plurality of data vectors with greatest density estimates, as determined by the calculating means;

number selecting means for selecting a second selected number of the partitioned group as candidates for the boundary vectors, the candidates for the boundary vectors including the second selected number of the partitioned group with lowest density estimates, as determined by the calculating means; and, vector selecting means for selecting the boundary vectors from the candidates for the boundary vectors.

15. Storage media as in claim 14 wherein, for each data vector in the plurality of data vectors in turn being a current vector, the calculating means:

locates a third selected number of data vectors from the plurality of data vectors which are nearest to the current data vector, calculates an average distance from the current data vector to each of the third selected number of data vectors from the plurality of data vectors which are nearest to the current data vector, and estimates a density estimate for the current data vector as one divided by the calculated average distance.

16. Storage media as in claim 15 wherein the third selected number is equal to a total number of data vectors in the plurality of data vectors minus one.

17. Storage media as in claim 14 wherein the calculating means utilizes a K-D tree.

18. Storage media as in claim 14, wherein the software, when executed on a computing system, additionally comprises:

scaling means for scaling vector components of all data vectors within the plurality of data vectors so that the plurality of data vectors are bounded by a unit hypercube, the scaling being performed before the calculating means calculates the density estimate for each data vector in the plurality of data vectors.

19. Storage media as in claim 14 wherein the vector selecting means selects all the candidates for the boundary vectors as the boundary vectors.

20. Storage media as in claim 14 wherein the vector selecting means includes:

selecting means for selecting, for all possible pairings of the candidates for boundary vectors, a pairing of candidates for boundary vectors which are closest together; and, removing means for removing, from the candidates, a candidate from the pairing of selected candidates which has a higher density estimate as calculated by the calculating means;

wherein the selecting means selects pairs of candidates and the removing means removes candidates until a number of remaining candidates is equal to a third selected number, the vector selecting means selecting the third selected number of remaining candidates as the boundary vectors.

* * * * *